United States Patent [19]

Mayrand

[11] 4,272,307
[45] Jun. 9, 1981

[54] INTEGRATED CIRCUIT WITH I²L AND POWER TRANSISTORS AND METHOD FOR MAKING

[75] Inventor: James F. Mayrand, Shrewsbury, Mass.

[73] Assignee: Sprague Electric Company, North Adams, Mass.

[21] Appl. No.: 19,971

[22] Filed: Mar. 12, 1979

[51] Int. Cl.³ .................. H01L 21/74; H01L 21/22; H01L 29/167; H03K 19/091
[52] U.S. Cl. .................................. 148/187; 148/175; 148/190; 148/191; 357/48; 357/63; 357/90; 357/92
[58] Field of Search .................. 357/92, 89, 63, 48, 357/90, 44, 46; 148/175, 185, 190, 191, 187

[56] References Cited

U.S. PATENT DOCUMENTS 3,707,410  12/1972  Tauchi et al. ..................... 357/20

FOREIGN PATENT DOCUMENTS 2453134  5/1976  Fed. Rep. of Germany ............. 357/92
2800240  7/1978  Fed. Rep. of Germany ............. 357/92

OTHER PUBLICATIONS

Okabe et al., IEEE International Solid State Circuits Conf., Dig. Tech. Papers, Feb. 1978, pp. 44-45.
Watanabe et al., Proc. 8th Conf. on Solid-State Devices, Tokyo, 1976, pp. 143-146, (Japan J. of Applied Physics, Suppl. 16-1, 1977).
Bergmann, IEEE J. of Solid State Circuits, vol. SC 12, No. 5, Oct. 1977, pp. 566-572.
Yagi, Proc. 6th Conf. on Solid State Dev., Tokyo, 1974, pp. 279-283.

Primary Examiner—William D. Larkins
Attorney, Agent, or Firm—Connolly and Hutz

[57] ABSTRACT

An integrated circuit has a P-type substrate and two N-type epitaxial layers. P-type isolation walls define pockets in the dual-layer epitaxial material, a power transistor being formed in one and an inverted I²L transistor being formed in another of the pockets. An upper buried layer doped with antimony (N-type) at the interface between the two epitaxial layers extends into the outer epitaxial layer forming a N+N holes-barrier junction. This junction is spaced from the depletion region of the normally forward biased base emitter junction by from 0.1 to 0.45 holes-diffusion lengths to provide high emitter efficiency in 0.5 to 5 ohm-cm epitaxial material. The P-type bases of the two kinds of transistors have the same depth but the N-type emitter of the power transistor is shallower than the N-type collector of the inverted transistor although formed earlier. Breakdown voltage of the power transistor is thus enhanced while the base width of the I²L transistor is predictable and uniform being substantially determined by late and independent process steps.

7 Claims, 2 Drawing Figures

INTEGRATED CIRCUIT WITH I²L AND POWER TRANSISTORS AND METHOD FOR MAKING

BACKGROUND OF THE INVENTION

This invention is related to an integrated circuit having an I²L, integrated inverted logic, transistor and a bipolar power transistor, and more particularly to such an integrated circuit having two epitaxial layers wherein the emitter of the I²L transistor includes an N+N holes-barrier junction.

It is known to make an integrated circuit with two epitaxial layers wherein a power transistor is formed in one epitaxial pocket and an inverted I²L transistor is formed in another. A lower buried layer at the substrate is substantially spaced from the base of the power transistor to provide in the power transistor a high $BV_{CEO}$. An upper buried layer at the interface of the two epitaxial layers reaches the depletion region of the forward biased base-emitter junction to obtain enhanced up-gain by the conventional mechanisms of increasing the ratio of the impurity concentrations in the emitter and base, respectively. This ratio and thus the up-gain of such prior art I²L transistors is subject to change as a function of variations in the upper epitaxial growth step and the impurity doping and driving steps needed to form other regions in the integrated circuit. The bases of all the transistors are simultaneously formed in one masking and one impurity diffusion step. Also, the power transistor emitter is formed simultaneously with the collector(s) of the inverted transistor.

In the practice of the aforementioned prior art, the control of the depth of the power transistor emitters and inverted transistor collectors tends to be critical and a compromise is made whereby the base width in the power transistor must remain large enough to prevent punch through and the approximately same base width in the inverted transistor must be shallow enough to provide adequate up-current gain in the inverted transistor. This problem is partially overcome by establishing the upper buried layer closely adjacent to the base of the inverted transistor and by using a fast diffusing n-type impurity (e.g. phosphorous) in the upper buried layer, to diminish the base width and to increase the aforementioned up-gain, but thereby entailing even more precise control of the process. The actual breakdown voltage $BV_{CEO}$ of the power transistor in many instances must be made close to the intended operating collector voltage while the gain of the inverted transistor is just sufficient to insure reliable I²L gate operation. More generally the extent of impurity diffusions, impurity concentrations, and the upper buried layer thicknesses all tend to be critical.

It is an object of this invention to provide an improved method for making an integrated circuit having a power transistor and an I²L transistor with higher yields or requiring less critical controls in manufacturing or both.

It is another object of this invention to provide an integrated circuit having a power transistor and an I²L transistor wherein at the base emitter transition there is a PNN+ double barrier junction.

It is a further object of this invention to provide an improved method for making such an integrated circuit wherein the $BV_{CEO}$ of the power transistor and the up-current gain of the inverted transistor may be controlled by relatively independent process steps.

It is yet a further object of this invention to use high resistivity epitaxial layers for providing high $BV_{CEO}$ power transistors while also providing adequate up-gain in the I²L transistors.

SUMMARY OF THE INVENTION

An integrated circuit contains in one electrically isolated pocket an NPN integrated inverted logic (I²L) transistor and in another isolated pocket an NPN transistor. The isolated pockets are in a dougle N-type epitaxial layer having been grown on a P-type silicon substrate. The N-type emitter and N-type collector of the power and I²L transistors, respectively, extend from the outer epitaxial surface part way into the respective bases.

In the I²L transistor pocket, a heavily antimony doped buried layer lies at the interface between the epitaxial layers, and forms with the upper layer an N+N junction which is spaced from the depletion region of the normally forward biased (0.7 volts) base-emitter junction a distance of from 0.1 to 0.45 times the characteristic holes-diffusion-length of the upper epitaxial layer.

Standard process steps are employed for making the integrated circuit including selectively predoping, at the I²L transistor pocket, the exposed face of the first epitaxial layer with antimony atoms after which the second layer, and the power transistor emitter, are formed. The substrate is subsequently heated to expand the antimony buried layer toward the I²L transistor base so as to create the abrupt N+N junction having the above noted distance from the base. The bases and the I²L collector are preferably formed after the above heating step for driving the arsenic buried layer.

The emitter incorporating an N+N barrier-junction in an I²L transistor of this invention provides a predictable and a high emitter efficiency leading to the further advantage that for a given tolerance on the up-gain, one can use a more narrow base width, i.e., space between the collector-base (NP) and base-emitter (PN) junctions.

The double epitaxial layer integrated circuit of this invention which includes both I²L transistors and power transistors is advantageously manufactured employing one sequence of pre-doping and driving steps to create the bases in all transistors while using independent steps to create the emitters of the power transistors and the emitters of the I²L transistors. The wider base widths in the power transistors provides high punch through voltages in the base while the narrower base widths in the I²L transistors provides high up-gain in the I²L transistors and the complex art of "emitter diffusion" can be practiced for each transistor type, relatively unfettered by extraneous considerations, i.e., independently of the steps for forming the other type transistor in the integrated circuit.

DESCRIPTION OF THE PREFERRED EMBODIMENTS

Figure 1:
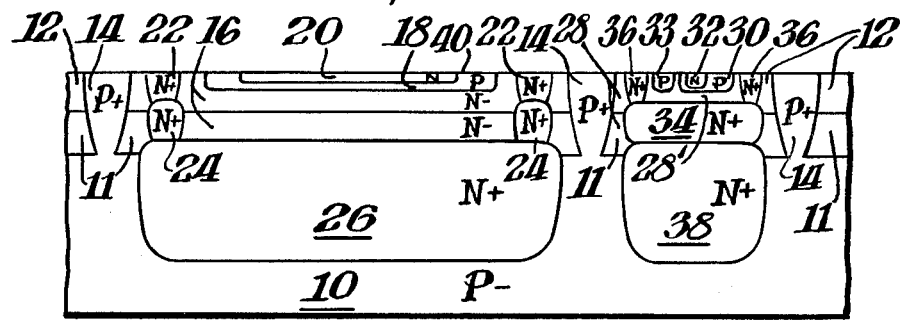
FIG. 1 shows in cross sectional side view an integrated circuit of this invention having a power transistor and an I²L transistor. The scale in the vertical direction is magnified about one order of magnitude over the scale in the horizontal direction.

The integrated circuit shown in FIG. 1 has a P-type substrate 10 and two N-type epitaxial layers 11 and 12. A system of P-type isolation walls 14 defines an electrically isolated pocket 16 in which there is formed a power transistor utilizing the dual epitaxial pocket material as a collector and having a P-type base 18 and an N-type emitter 20. An annular N-type guard ring composed of abutting rings 22 and 24 is in contact with an N-type buried layer 26 so as to enclose the power transistor and to prevent the formation of unwanted parasitic transistors, e.g., the potential PNP including regions 18, 16 and 14.

The isolation walls 14 also define an epitaxial pocket 28 wherein an I$^2$L type inverted transistor is formed having a P-type base region 30, an N-type collector region 32. A P-type injector region 33 lies adjacent to and spaced from the base region 30. An elevated or upper buried layer 34 of N-type is formed in pocket 28 at the interface between epitaxial layers 11 and 12. An N-type guard ring 36 surrounds the base 30 and may but does not necessarily contact the buried layer 34. Another deeper buried layer 38 of N-type, positioned at the interface of the pocket 28 and the substrate 10, abuts the upper buried layer 34.

Integrated circuit chips of the kind described were made as follows: A silicon wafer 10 having a crystal orientation 111 and containing about 10$^{14}$ P-type impurity atoms per cubic centimeters had an oxide layer grown over the surfaces. The oxide was photolithographically opened in the regions corresponding to the buried layers 26 and 38. The wafer was then heated to 1250° C. in an atmosphere containing antimony atoms which were further driven in by diffusion at 1250° C. for 16 hours. The oxide was chemically removed and an epitaxial layer 11 of about 5 microns thickness and containing about 2×10$^{15}$ N-type impurity atoms per cubic centimeter was grown over the wafer surface. The epitaxial layer 11 was grown by the well known method of heating (for 22 minutes at 1140° C.) and exposing the substrate 10 to a gaseous mixture containing a silicon precursor compound, namely silicon tetrachloride, and a gaseous precursor of dopant impurities of N-type polarity, namely phosphine.

An oxide mask was then formed over the surface of epitaxial layer 11 with an opening in the regions of the guard ring 24 and the upper buried layer 34. The substrate was heated at 1150° C. in the presence of antimony impurities that were diffused (from gaseous antimony trioxide) through the mask openings into the epitaxial layer 11. The substrate was then heated to drive these antimony impurities at 1150° C. for 40 minutes. The masking oxide was then removed and the wafer subjected to the same epitaxial growth steps as described above to form the epitaxial layer 12. Epitaxial layer 12 thus has the same thickness and properties as that of layer 11, which is process-wise-convenient but not functionally necessary.

By masking again and heating at 1150° C. for 1.5 hours to diffuse boron through the epitaxial layers 11 and 12, the isolation walls 14 were partially formed. The walls 14 are driven to the substrate 10 by later heating steps to be described. Subsequently, by conventional photolithographic masking and diffusion steps, phosphorous was diffused into the epitaxial layer 12 to form N-type rings 22 and 36.

Another oxide mask was formed having an opening over a central portion of the yet to be formed base region 18 of the power transistor. The substrate was heated for 20 minutes at 1250° C. in the presence of arsenic-doped silicon grains to produce a shallow emitter 20 of about 1.3 microns thickness and having an average resistivity of about 0.001 ohm-centimeters. During the above noted heating to drive the arsenic emitter (20), the upward extension of the antimony buried layer 34 predictably and controllably increases (0.4 micron in the present example). Subsequent heating steps, to be described, effect a relatively small further extension of the buried layer 34.

In a modification of the above steps for forming the isolation walls 14, it will be advantageous to use double diffused isolation walls, whereby for example a selective predeposition of boron is made on the substrate 10 prior to growing either epitaxial layer. The driving of the antimony buried layer 34 and the arsenic emitter 20 would drive upwards this lower portion of the epitaxial wall. Now the upper portion of the wall need only be driven through the upper epitaxial layer and thus would require a shorter drive time (about 40 minutes). This leads to a capability for even higher density packing of the integrated transistors.

The bases 18 and 30, as well as injector region 33, were then formed by providing a new mask, predepositing from a boron trioxide source a thin layer of boron atoms on the epitaxial surface 40 and heating for 50 minutes at 1130° C. to provide base regions 18 and 30 having a thickness of 2.5 microns and an average resisitivity of 0.03 ohm-centimeters.

The process thus far described includes steps for forming all of the regions shown in FIG. 1 except steps for forming the collector region 32 of the I$^2$L inverted transistor. A new oxide mask was provided for this purpose and the substrate heated for 22 minutes at a temperature of 1070° C. in an atmosphere of phosphorous oxichloride (POCl$_3$). The collector region 32 has a thickness (from 0 to d$_1$ in FIG. 2) of 2.0 microns, consequently providing a base width (from d$_1$ to d$_3$) of about 0.5 microns in the I$^2$L transistor. The measured current gain of the PNP injector and inverted NPN I$^2$L combination is 12 to 15. By calculations, the gain of the PNP injector transistor was determined to be about 3. The up-current gain of this I$^2$L transistor is thus about 4.

Employing the above noted standard process steps, the depth of the bases 18 and 30 are controlled to within ±0.1 micron, the upward extent of the upper buried layer 34 is controlled to within ±0.1 micron, and the thickness of the upper epitaxial layer 12 is controlled to within ±0.5 micron (at 1 standard deviation).

Figure 2:
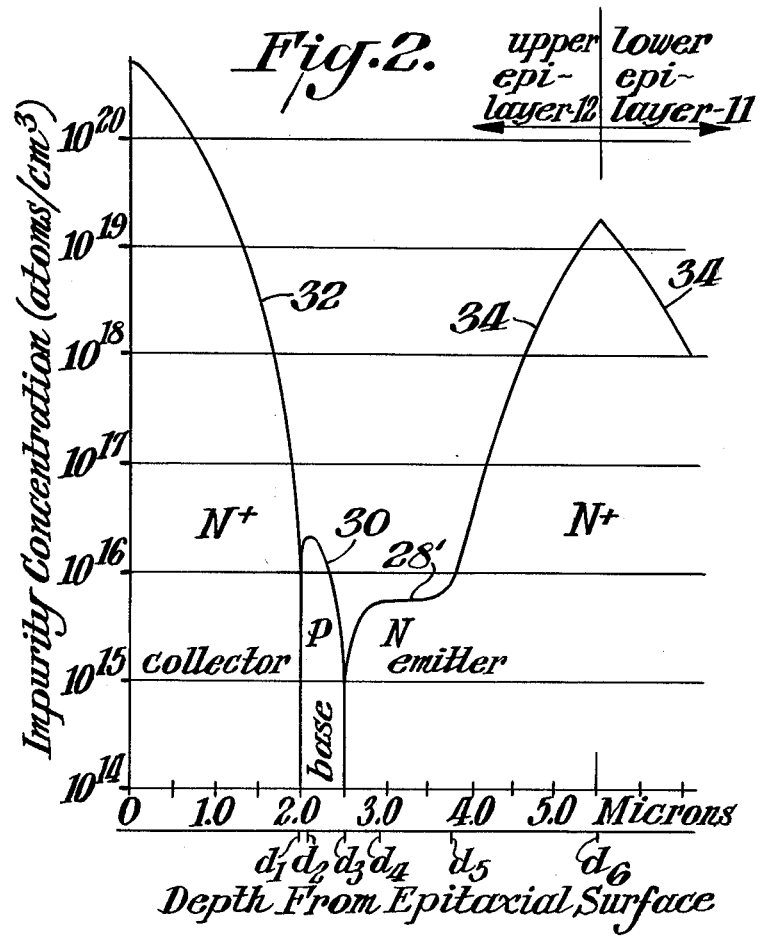
FIG. 2 is a graph of impurity concentrations taken in a central portion of the I²L transistor shown at the right in the integrated circuit of FIG. 1.

A distinctive feature of the I$^2$L transistor of this invention, is the abrupt N+N junction consisting of buried layer 34 and the adjacent epitaxial N region 28', seen at d$_5$ in FIG. 2. More particularly the buried layer 34 has a steep gradient at this N+N junction to provide a minority carrier blocking layer there, and further the impurity concentration in the adjacent unaltered epitaxial region 28' is essentially constant from the N+N junction to the base region 30. These two regions 34 and 28' together serve as the emitter of the I$^2$L transistor. The emitter efficiency of the N+N containing emitter is substantially greater than if there were no buried layer 34 or if the buried layer 34 were far removed from the base.

The steep gradient of impurity concentration in the buried layer 34 (at d$_5$) is achieved here by using a characteristically slowly diffusing dopant, namely antimony. Arsenic is also slowly diffusing but is unsuitable because of its relatively higher vapor pressure. Phosphorous is unworkable because it is so fast a diffusing dopant. The use of phosphorous leads to a shallow impurity concentration gradient that does not form an effective blocking N+N junction.

The N+N junction is capable of repelling minority carriers (holes) that may have been injected from the base 30 into the lightly doped unaltered portion 28' of the epitaxial layer 12, thus increasing the emitter efficiency and up-gain of the inverted I²L transistor. This barrier mechanism is more completely explained in the paper by H. Yagi et al., entitled "A Novel and High Performance Bipolar Device of Low Emitter Impurity Concentration Structure", Proceedings of the 6th Conference on Solid State Devices, Tokyo, 1974. For this N+N junction to provide an effective barrier to holes, the above noted gradient of the impurities in the buried layer 34 at the N+N junction ($d_5$) must be greater than about $2 \times 10^{22}$ atoms/cm$^4$. The location of the N+N junction, $d_5$, is defined herein as the points where the N-type impurity concentration is twice that of the unaltered epitaxial layer, e.g. in the adjacent region 28'.

The depletion region extends into the epitaxial layer 12 (of 1.5 ohm-cm) and the base 30 about 0.8 microns from $d_2$ to $d_4$ when the base-emitter junction is normally forward biased (0.7 volt). Optimum emitter efficiencies are obtained when the distance from this depletion region at $d_4$ to the N+N junction at $d_5$ is from about 0.1 to 0.45 times the diffusion length for holes in the intervening low impurity concentration epitaxial material 28' of layer 12, the diffusion length at 1 $\Omega$cm being 5 microns. In 0.5 to 5 ohm-cm. epitaxial material, the range of most practical use in the power transistor, the width of the depletion region ranges only from 0.3 to 1 microns at the base-emitter junction of the I²L transistor, and the holes diffusion length is from 4 to 10 microns. From the theory in the above noted Dutton paper, epitaxial resistivities in this range are also workable in the I²L transistor emitter. However, the predictability and uniformity of I²L emitter efficiency tends to increase as the resistivity of the upper epitaxial layer (12) increases. From such theoretical considerations it is judged that the resistivity of the upper buried layer should be greater than about 0.7 ohm cm corresponding to $8 \times 10^{15}$ atoms/cm$^3$ when only standard processes are employed. I²L transistors of the prior art are typically made in epitaxial material of less than 0.7 ohm-cm and substantially all use epitaxial resistivities of less than 1 ohm-cm.

Thus in production, the tolerance on the dimensions of this essentially unaltered epitaxial space 28', serving as an essential portion of the emitter for the inverted I²L transistor, is relatively generous, permitting only usual care and control of process steps such as the upper epitaxial growth step, the doping and driving with P-type impurities to form the base 30, the pre-doping with antimony and its diffusion during epitaxy and forming the power transistor emitter 20.

The heating-diffusion steps for forming the arsenic emitter 20 of the power transistor preceded the forming of the bases 18 and 30 and preceded forming the collector 32 of the inverted transistor, so that base depths as well as the depth of collector region 32 are independent of that arsenic diffusion step. The heating steps for forming the bases and collector region 32 are relatively mild and cause essentially no further expansion of the inherently slow diffusing arsenic.

Power transistors made in 5 ohm-cm double epitaxial layers totaling 10 microns thick as described above provide a BV$_{CEO}$ of about 40 volts and a gain of approximately 60. The I²L transistor may also be used in the down mode for linear amplification of small signals, being powered from about a 5 DC volts power supply.

What is claimed is:

1. A method for making an integrated circuit having a power transistor in one epitaxial pocket and an I²L transistor in another epitaxial pocket, chronologically comprising:
   (a) forming first N-type epitaxial layer on a face of a P-type silicon substrate;
   (b) predoping a portion of the exposed face of said first epitaxial layer with antimony atoms;
   (c) forming over said first layer a second N-type epitaxial layer;
   (d) at least partially electrically isolating said one and another pockets in said layers so that said predoped face portion is in said another pocket;
   (e) forming an N-type emitter region in said one pocket extending into said second layer from the outer surface thereof;
   (f) heating said substrate, to further expand said emitter, to complete said electrically isolating, and to drive said antimony atoms to form an N-type buried layer at the interface between said layers in said another pocket creating an N+N holes-barrier junction with the unaltered portion of said epitaxial layer;
   (g) diffusing two P-type base regions extending from the outer surface of and part way through said second epitaxial layer for said power transistor in said one pocket and for said inverted I²L transistor in said another pocket, respectively; and
   (h) diffusing an N-type collector region extending from said surface part way into said I²L transistor base region.

2. The method of claim 1 wherein said electrically isolating includes diffusing P-type impurities into said second epitaxial layer to partially form a PN junctions isolation wall between said pockets and further includes further driving said P-type impurities during said heating to complete the formation of said wall.

3. The method of claim 1 wherein said forming said N-type emitter region in said one pocket comprises introducing arsenic atoms into said emitter region.

4. The method of claim 3 wherein said diffusing of said bases includes: providing a mask over said surface having two holes over a portion of the surface areas of said one and another pockets, respectively; predepositing a thin layer of boron atoms on said pocket surface areas; and heating said substrate to drive and diffuse said bases to about the same depth from said surface.

5. The method of claim 4 wherein said heating to diffuse said bases is at a temperature of about 1130° C. for about 50 minutes to form bases each having a depth of about 2.5 microns.

6. The method of claim 4 wherein said diffusing of said I²L transistor collector comprises: after diffusing said bases, providing a mask over said surface with a hole over a portion of the surface area of said I²L transistor base; and heating said substrate in the presence of an N-type impurity to form said collector region having a thickness that is greater than the thickness of said power transistor emitter region.

7. The method of claim 6 wherein said heating to diffuse said collector is at a temperature of about 1070° C. for about 22 minutes in a phosphorous containing atmosphere to produce a collector region having a thickness of about 2.0 microns.

* * * * *